(12) United States Patent
Ruckerbauer et al.

(10) Patent No.: US 7,796,446 B2
(45) Date of Patent: Sep. 14, 2010

(54) MEMORY DIES FOR FLEXIBLE USE AND METHOD FOR CONFIGURING MEMORY DIES

(75) Inventors: Hermann Ruckerbauer, Moos (DE); Michael Bruennert, Munich (DE); Ullrich Menczigar, Vaterstetten (DE); Christian Mueller, Taufkirchen (DE); Sitt Tontisirin, Munich (DE); Georg Braun, Holzkirchen (DE); Dominique Savignac, Ismaning (DE)

(73) Assignee: Qimonda AG, Munich (DE)

( * ) Notice: Subject to any disclaimer, the term of this patent is extended or adjusted under 35 U.S.C. 154(b) by 165 days.

(21) Appl. No.: 12/234,312

(22) Filed: Sep. 19, 2008

(65) Prior Publication Data

US 2010/0074038 A1    Mar. 25, 2010

(51) Int. Cl.
G11C 7/10    (2006.01)

(52) U.S. Cl. .............. 365/189.05; 365/63; 365/189.02; 365/189.18

(58) Field of Classification Search ............. 365/189.18
See application file for complete search history.

(56) References Cited

U.S. PATENT DOCUMENTS

| | | | | |
|---|---|---|---|---|
| 4,669,064 A | * | 5/1987 | Ishimoto | 365/189.05 |
| 5,295,099 A | * | 3/1994 | Kagami | 365/189.06 |
| 5,838,632 A | * | 11/1998 | Joo | 365/239 |

* cited by examiner

Primary Examiner—Tan T. Nguyen

(57) ABSTRACT

A memory die, including a memory array, a memory array data terminal and a data bus that includes a first sub bus and a second sub bus is disclosed. A first bi-directional buffer arranged between the memory array data terminal and the first sub bus and a second bi-directional buffer arranged between the memory array data terminal and the second sub bus is also disclosed. The first and second bi-directional buffers are adapted to couple the first sub bus or the second sub bus to the memory array data terminal at a time.

19 Claims, 10 Drawing Sheets

MEMORY DIES FOR FLEXIBLE USE AND METHOD FOR CONFIGURING MEMORY DIES

BACKGROUND

Memory stacks are built by stacking memory dies on top of each other. Each memory die contains a memory array and associated control logic or data buses for distributing the data received from the array. In some single-rank implementations, all different dies belong to a single logical memory device, called a rank. To this end, the memory arrays of the dies are electrically coupled to each other in order to be accessible by common control data lines and word lines (data paths). This interconnection may be achieved by through silicon vias or bonding, i.e., by bonding associated pins of the memory dies to one common terminal. In other implementations, dual or multi-rank devices are constructed, in which multiple memory dies stacked on top of each other correspond to two or more different ranks. To this end, only the control data lines of those dies corresponding to a single-rank are electrically coupled.

Furthermore, the memory dies may support different I/O modes, such as, for example, a ×4 I/O and an ×8 I/O mode. In order to manufacture the different stacks required by the market, multiple configurations of memory dies are produced, such as, for example, one ×4 I/O mode for single-rank implementations and one ×4 I/O die for dual-rank implementations. Of course, for ×8 I/O configurations, the same distinction between the memory dies has to be made in order to provide memory dies comprising interconnection circuitry suited for single-rank as well as for dual-rank implementations. That is, multiple different memory dies are developed and separately put on stock. Furthermore, if one memory die or the memory array of the die fails in a quality test, the complete hard-wired memory stack may be rendered unusable, only due to the defect of one memory die of, for example, eight memory dies in a common dual-rank implementation. As a consequence, the remaining seven layers of the stack would be sorted out together with one failing layer, which may result in yield numbers below 20%.

SUMMARY OF THE INVENTION

Some embodiments of the present invention provide a memory die having a memory array and an associated memory array data terminal, which may be connected either to a first sub bus or to a second sub bus of a data bus. To this end, a first bi-directional buffer is arranged between the memory array terminal and the first sub bus and a second bi-directional buffer is arranged between the memory array data terminal and the second sub bus.

BRIEF DESCRIPTION OF THE DRAWINGS

Several embodiments of the present invention are subsequently described by referring to the enclosed drawings, wherein.

DETAILED DESCRIPTION OF ILLUSTRATIVE EMBODIMENTS

Several embodiments of the present invention will in the following be described referencing the enclosed figures.

Figure 1:
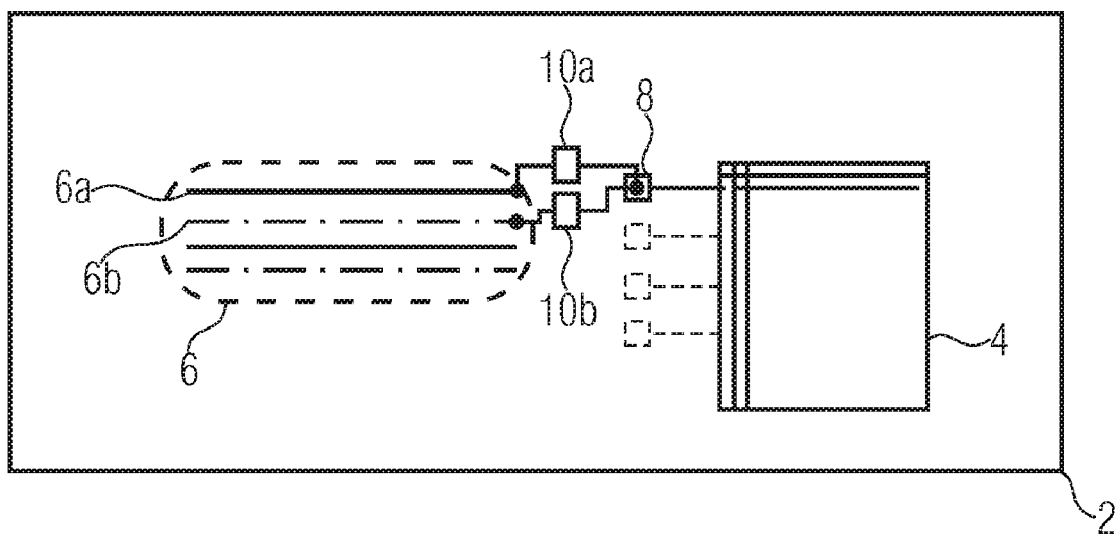
FIG. 1 shows an embodiment of a memory die.

FIG. 1 shows an embodiment of a memory die 2, comprising a memory array 4 and a data bus 6 adapted to be connected to a memory array data terminal 8 of the memory array 4. The memory array data terminal may, for example, be adapted to carry word-data or control-data. It may therefore be used to carry individual bits of an address of memory cells within the memory array 4, or to carry data to be stored in or to be read from the memory array 4.

However, the memory array data terminal 8 may also be used to carry or to provide arbitrary other data, such as, for example, global control data (rank selection or the like). To be more precise, the memory array data terminal 8 may be used to provide or read any kind of data to or from the memory array 4.

The data bus 6 comprises a first sub bus 6a and a second sub bus 6b, wherein in the specific embodiment of FIG. 1, the data paths or data lines of the two sub buses 6a and 6b are interleaved, i.e., the data lines of the first sub bus 6a alternate with the data lines of the second sub bus 6b.

This is, of course, only one possible implementation of a respective data bus. All further alternative implementations are feasible, for example, arranging all data lines of the first sub bus 6a next to each other and arranging all data lines of the second sub bus 6b next to each other. Furthermore, the sub buses or the data paths within the sub buses may not only be arranged parallel to the surface of the memory die 2. They may also extend through the memory die in a vertical direction. That is, the sub buses may, in the face on view of FIG. 1, extend in a direction rectangular to the surface of the memory die.

A first bi-directional buffer 10a is arranged between the first sub bus 6a and the memory array data terminal 8 and a second bi-directional buffer 10b is arranged between the second sub bus 6b and the memory array data terminal 8. The first bi-directional buffer 10a and the second bi-directional buffer 10b are adapted to couple a first sub bus 6a or the second sub bus 6b to the memory array data terminal 8 at a time. The bi-directional buffers may be implemented in any possible way allowing the flow of data in both directions, i.e., from the memory array data terminal 8 to the sub buses or vice versa.

This provides the flexibility to electrically connect (couple) either the first sub bus 6a (via the first bi-directional buffer 10a) or the second sub bus 6b (via the second bi-directional buffer 10b) with the memory array data terminal 8. This flexibility may be used to implement redundancies, for example, switching the data transfer from the first sub bus 6a to the second sub bus 6b or vice versa, when one of the sub buses is inoperative. Furthermore, only one single die type may be used to implement various different stacking options. If, for example, through silicon vias or other inter-die-bondings exist, which physically connect different memory dies within a memory stack, the coupling to the first sub bus 6a may be chosen for a first stacking option and the coupling to the second sub bus 6b may be chosen for a second stacking option. That is, for example, dual rank stacks may be generated in 4× I/O configurations, using either the first sub bus 6a or the second sub bus 6b.

When one of the sub bus interconnections is broken, the gained flexibility may also be used to implement a redundancy, in that the one particular sub bus which is fully operational can be chosen.

It may be noted that, for the sake of simplicity, only two signal lines 6a or 6b of the respective sub buses are discussed in FIG. 1. It is, of course, possible to implement an arbitrary number of memory array data terminals with corresponding numbers of signal lines of respective sub buses. To this end, the bi-directional buffers may be globally controlled, in order to switch all memory array data terminals to the same sub bus. According to further embodiments, the respective decision may be taken for each memory array data terminal individually.

It should be noted that the gain of flexibility may have the effect that a single memory die may serve for multiple applications, such that different manufacturing lines and associated administrative overhead when manufacturing and storing the respective different dies may be avoided.

Figure 2:
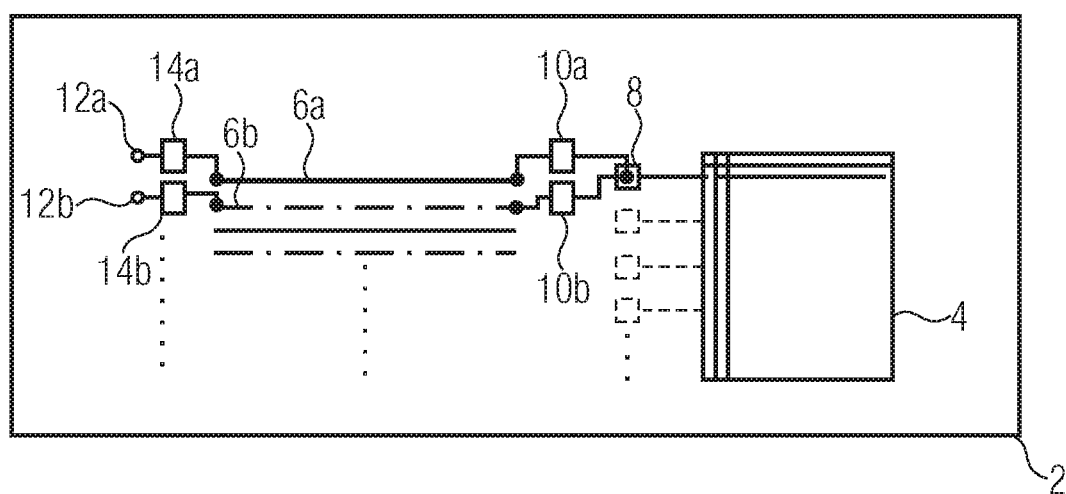
FIG. 2 shows a further embodiment of a memory die.

FIG. 2 shows a further embodiment of the present invention, which is based on the embodiment of FIG. 1. The same components are given the same reference numerals and, consequently, the description of their functionalities may also be applied to the embodiment of FIG. 2. Moreover, like or functional identical components are given the same reference numerals within this application. The description of the respective functionality is, therefore, applicable to further embodiments not particularly discussed within a figure. In general, individual features described in particular embodiments may be arbitrarily combined to form further embodiments.

Given the above, only the difference of the embodiment of FIG. 2 with respect to FIG. 1 is elaborated in more detail now.

The embodiment of FIG. 2 further comprises a first external data path 12a and a second external data path 12b, wherein both external data paths are adapted to electrically couple to a further memory die. The first external data path 12a and the second external data path 12b may be through silicon vias, as indicated in FIG. 2. Alternatively, other implementations are feasible, which provide the possibility to electrically couple to a further memory die, such as, for example, bond wires, external circuitry or the like.

The embodiment of FIG. 2 furthermore comprises a third bi-directional buffer 14a arranged between the first external data path 12a and the first sub bus 6a and a fourth bi-directional buffer 14b arranged between the second external data path 12b and the second sub bus 6b. According to one embodiment of the present invention, the third bi-directional buffer 14a couples the first external data path 12a and the first sub bus 6a when the first bi-directional buffer 10a couples the first sub bus 6a and the memory array data terminal 8, whereas the fourth bi-directional buffer 14b couples the second external data path 12b and the second sub bus 6b, when the second bi-directional buffer 10b couples the second sub bus 6b and the memory array data terminal 8.

That is, flexibility is gained, to which external data path a memory array data terminal 8 may be coupled to. Furthermore, it may be feasible to disconnect the memory array 4 of the embodiment of FIG. 2 from both external data paths 12a and 12b completely. This may be utilized to provide redundancy on a chip-level, i.e., to couple multiple chips to form a memory stack, wherein the third and fourth bi-directional buffers 14a and 14b may allow to use one particular memory die as a spare device, which is only coupled to the external data path, when other memory dies in the stack fail. Embodiments of stacked memory dies and associated stacks as well as embodiments of methods to configure such memory dies in a memory stack will be elaborated in more detail below.

Generally, those external data paths of memory dies within the stack may be selectively coupled (connected) which correspond to the desired configuration. To this end, the external data paths 12a and 12b may, of course, be implemented using different feasible techniques. For example, instead of through silicon vias, i.e., of the conductive structures extending across the width of the memory die, front/back-side interconnection of the dies (modules) may be used. That is, internal data paths within a memory die may be used, which end in a data terminal on both opposite sides of the die, such that the associated data terminals are connected to each other, when building the stack.

In a further embodiment, the second bi-directional buffer 10b disconnects the memory array data terminal 8 from the second sub bus 6b, whereas both of the third and the fourth bi-directional buffers 14a and 14b couple the external data paths 12a and 12b to the corresponding sub buses 6a and 6b. This may be utilized to apply a reference potential to the second external data path 12b and the second sub bus 6b, which shields the sub bus 6a or individual data lines of the sub bus 6a from possibly influencing neighbors.

Such a configuration may be defined as a high data-bandwidth mode, where both, the first external data path 12a and the second external path 12b couple to their corresponding sub buses. In a low data-bandwidth mode, only one of the third bi-directional buffer 14a or the fourth bi-directional buffer 14b may couple to the corresponding sub bus, when, for example, no shielding is required.

In a further embodiment detailed below, the implementation of a low data-bandwidth mode and a high data-bandwidth mode may be achieved introducing first and second switches, arranged between the first sub bus and the reference potential and the second sub bus and the reference potential.

In a low data-bandwidth mode, one of the first switch or the second switch connects the respective sub bus to the reference potential only, while the other switch disconnects the sub bus from the reference potential. In a high data-bandwidth mode, both switches may disconnect the respective sub buses from the reference potential, such that both sub buses are used for data transfer.

Figure 3A:
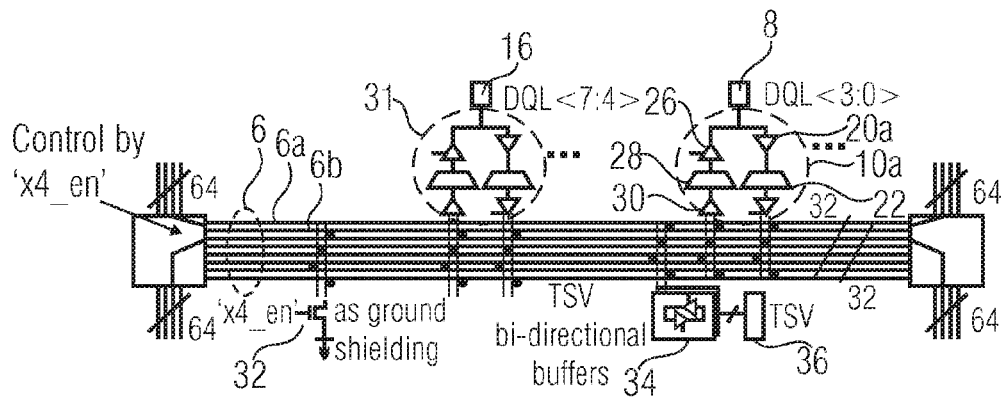
FIGS. 3a-3c show embodiments of flexible data bus configurations of memory dies.
Figure 3B:
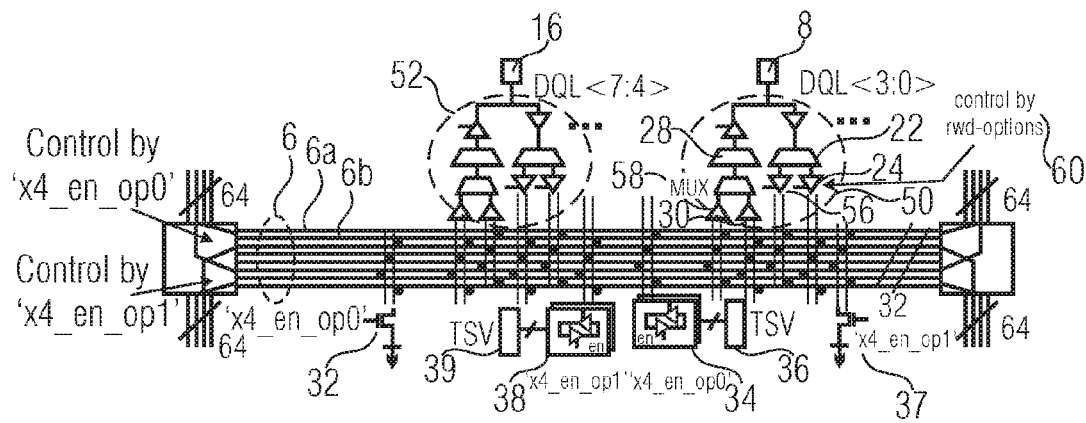
Figure 3C:
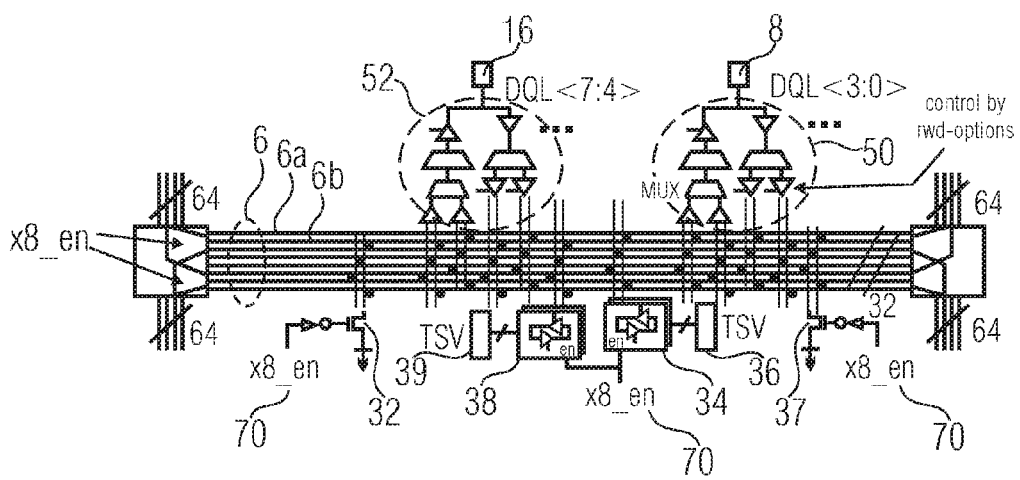

FIGS. 3a-3c show further embodiments of memory dies, wherein those illustrations are focused on the data bus 6 and on its internal connections as well as on its connections to external data paths. As the illustrations are focused on the data bus and on components allowing its flexible use, the memory array itself is not shown. However, the memory array data terminal 8 and a further memory array data terminal 16 are illustrated as two examples of memory array data terminals coupling the bus to the memory array. The data bus 6 comprises a first and a second sub bus 6a and 6b, the data paths associated to the individual sub buses being illustrated by bold lines for the first sub bus 6a and by normal lines for the second sub bus 6b.

The first bi-directional buffer 10a between the memory array data terminal 8 and the first sub bus 6a comprises a read sense-amplifier 20 arranged between the memory array data terminal 8 and a multiplexer 22. A line driver 24 is arranged between the multiplexer 22 and the first sub bus 6a. As illustrated in FIG. 3a, data is read from the memory array via memory array data terminal 8, the associated sense-amplifier 20, the multiplexer 22 and the line driver 24, which outputs the data read to the first sub bus 6a. The write-path of the bi-directional buffer 10a comprises a second line driver 26 arranged between the memory array data terminal 8 and a second multiplexer 28. A sense-amplifier 30 is arranged between the first sub bus 6a and the multiplexer 28.

A further bi-directional buffer 31 is arranged between the second memory array data terminal 16 and the second sub bus 6b. The components of the further bi-directional buffer 31 are identical to the components of the first bi-directional buffer 10b, such that a repeated description of the corresponding individual components is omitted. It may be furthermore noted that, for the sake of clarity, only one bi-directional buffer structure per sub bus is illustrated in FIGS. 3a-3c.

The examples of FIGS. 3a-3c illustrate data buses of memory dies with ×4 I/O and ×8 I/O. According to the configuration, either four or eight memory array data terminals are connected to a memory bus. It shall be understood that the individual bi-directional buffers 10a and 31 of FIGS. 3a-3c serve as a substitute for the four corresponding bi-directional buffers required to connect the desired number of memory array data terminals to the data lines of the corresponding sub buses. Furthermore, it should be understood that the chosen width of the sub buses and of the data bus are a mere example. That is, data buses and sub buses with other widths may also be used in that the ideas presented herein are applied to data buses with arbitrary width. That is multiple different I/O modes may be used, such as, for example, ×16 I/O modes or ×32 I/O modes.

The memory die of FIG. 3a further comprises a switch arranged between the second sub bus 6b and a reference potential.

In summarizing, the example for a memory die of FIG. 3a has a 64 bit bi-directional prefetch read/write data (RWD) bus with ×4 I/O and ×8 I/O options. In ×4 I/O mode, the second sub bus 6b may be pulled to the reference potential (e.g., to ground) via switch 32. The remaining half of the bus, i.e., the first sub bus 6a is used to connect to an interlayer connection, such as a through silicon via, in a memory stack. To this end, the data lines of the first data path 6a may be coupled, via a third bi-directional buffer 34, to interlayer connections 36. That is, only half of the data paths available may be used. In ×8 I/O mode of operation, the second memory array data terminal 16 would be coupled to the second sub bus 6b via the further bi-directional buffer 31.

Based on the example of FIG. 3a, FIG. 3b shows a further embodiment of the present invention, which further comprises a second switch 37, arranged between the first sub bus 6a and the reference potential, as well as a fourth bi-directional buffer 38, arranged between a second external data path 39 (the through silicon vias) and the second sub bus 6b.

Furthermore, the bi-directional buffers are modified, in order to provide bi-directional buffers 50 and 52, wherein the bi-directional buffer 52 comprises a first bi-directional buffer arranged between the memory array data terminal 8 and the first sub bus 6a as well as a second bi-directional buffer arranged between the memory array data terminal 8 and the second sub bus 6b. This is achieved by a further line-driver in the read path, i.e., by arranging a third line-driver 56 between the multiplexer 22 and the second sub bus 6b. The read-path may be altered accordingly, i.e., by arranging a third sense amplifier 58 between the second sub bus 6b and the multiplexer 28. The second buffer 52 is amended accordingly, such that both of the buffers provide the possibility to couple their associated memory array data terminals to either the first sub bus 6a or the second sub bus 6b, dependent on a control signal 60, which is received or evaluated by the buffers 50 and 52. To put it more generally, when starting from the example of FIG. 3a, configurable data paths may be implemented by using the inactive part of a read-write data bus 6 as a further data path option, i.e., by providing the possibility to connect to the corresponding sub bus or to disconnect from the corresponding sub bus. The additional circuitry in FIG. 3b is minimal.

The flexible use may furthermore be provided by using third and fourth bi-directional buffers 34 and 38 arranged between the signal lines of the first sub bus 6a and the second sub bus 6b and the interlayer connections (through silicon vias) 36 and 39. These may also be selectively enabled or disabled.

By programming the buffers 50 and 52, i.e., by using a control signal 60 indicating their mode of operation, different operation modes may be activated, using one single hardware implementation of a memory die.

In other words, the inactive RWD bus of FIG. 3a may also be connected to the interlayer interconnection via data buffers, such that it can be activated by programming at the cross circuits and the MUX/DEMUX circuits for data-path terminals (DQs). With such a configurable RWD bus, a dual rank stack device with ×4 I/O can be constructed by programming each rank to use its own data path, its own part of a RWD bus and associated through silicon vias. The memory die may also be used as a single rank stack device with ×4 I/O with a redundant data path. Furthermore, a single rank stack device with ×8 I/O may be created, by simply using the entire RWD bus (data bus 6) for ×8 I/O. In the ×4 I/O mode, which is a low data-bandwidth mode, (as compared to the high data-bandwidth mode with ×8 I/O), either the first or the second bi-directional buffer within buffer 50 couples the memory array data terminal 8 with the first sub bus 6a or the second sub bus 6b. Consequently, either the third bi-directional buffer 34 or the fourth bi-directional buffer 38 may be coupled to the corresponding sub bus in the low band with mode of operation.

In a high-band with mode, both the third bi-directional buffer 34 and the fourth bi-directional buffer 38 are coupled to the corresponding sub buses, in order to connect (couple) all signal lines of the sub bus 6 of the memory die with the corresponding signal lines of the further sub buses of the other memory dies in the stack via external data paths (for example, via the through silicon vias illustrated in FIG. 3b).

In the low-bandwidth mode of operation, either switch 32 or switch 36 couples its corresponding sub bus to the reference potential. In order to allow for a data flow, the bi-directional buffer associated with the other sub bus couples its associated sub bus to the through silicon vias. At the same time, one of the bi-directional buffers within buffer 50 couples the memory array data terminal 8 and the other sub bus.

In the high-bandwidth mode of operation, both buffers 50 and 52 couple their associated memory array data terminals 8 and 16 to one particular sub bus, i.e., buffers 50 couples to sub bus 6a and buffer 52 to sub bus 6b or vice versa. The switches 32 and 37 disconnect the used sub buses from the reference potential.

FIG. 3c shows a further embodiment of the present invention, which differs from the embodiment of FIG. 3b in that a common control signal 70 is used to control the third and fourth bi-directional buffers 34 and 38, as well as the first and second switches 32 and 37. That is, ×8 I/O mode may be selected by applying an appropriate common control signal 70.

In the embodiment of FIG. 3c, a logical high-signal may indicates the ×8 I/O mode. In that event, the first and second sub buses 6a and 6b are disconnected from the reference potential whereas, at the same time, the first and second sub buses 6a and 6b are coupled to the through silicon vias 36 and 39 via the third and fourth bi-directional buffers 34 and 38. Additionally, the first and second buffers 50 and 52 may be activated or controlled such, that either the first or the second buffer 50 or 52 couples to the first sub bus 6a. The remaining buffer may, consequently, connect the second sub bus.

From the embodiments discussed in FIGS. 3b and 3c, it becomes apparent that embodiments of the present invention may be implemented with only little additional circuitry. The gain in flexibility may lead to a significant reduction of costs for producing and storing the memory dies used in various stack combinations, since one memory die may be used in multiple stacking options. The cost of additional hardware may be low, since programmable tri-state switches in cross circuits or various I/O modes are normally available in a single die device. The tri-state switches for configurable RWD usually exist for the layout simplification and load balancing in the cross circuit. In that event, additional circuits may only be implemented at the input/output of the multiplexer/demultiplexer for the memory array data terminals 8 and 16, as shown in buffers 50 and 52.

Furthermore, additional multiplexers or control data paths may be foreseen in the control path (command/clock/address) to distribute the corresponding control signals of the through silicon vias.

Figure 4:
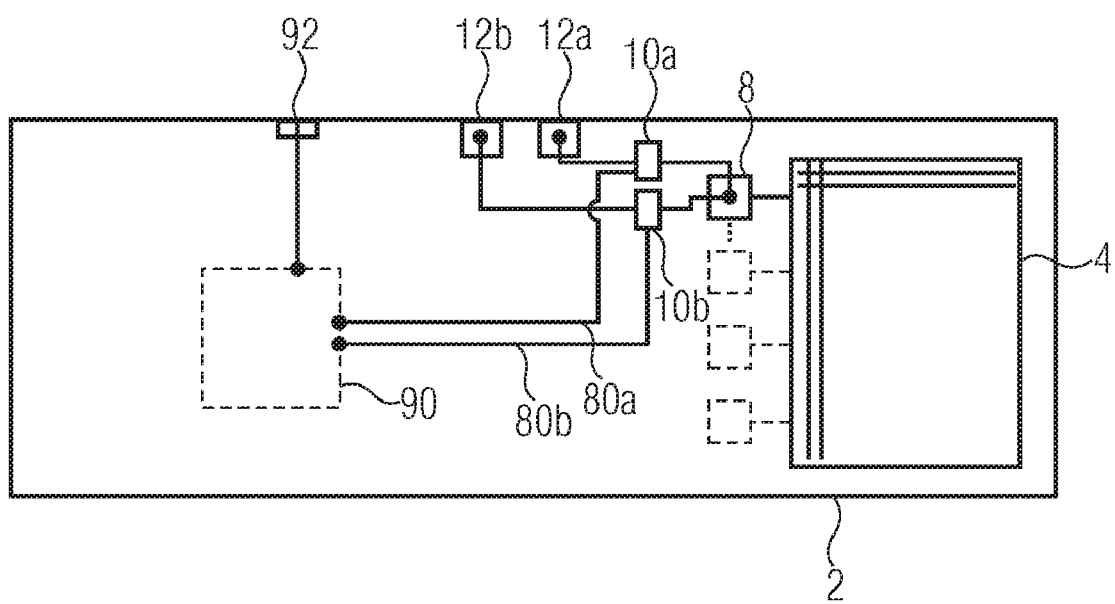
FIG. 4 shows a further embodiment of a memory die having external data paths electrically coupled to further memory dies.

FIG. 4 shows a further embodiment of the present invention, comprising a memory array 4 on a memory die 2, the memory array having the memory array data terminal 8 and, optionally, further memory array data terminals. The memory die 2 further comprises the first external data path 12a, which is adapted to be electrically coupled to a further memory die and the second external data path 12b, which is adapted to be electrically coupled to a further memory die. The first bi-directional buffer 10a is arranged between the memory array data terminal 8 and the first external data path 12a. The second bi-directional buffer 10b is arranged between the memory array data terminal 8 and the second external data path 12b. Although the memory array data terminal 8 and the first bi-directional buffer 10a are directly connected in FIG. 4, it may be noted that arbitrary additional circuitry may be placed between the memory array data terminal 8 and the first bi-directional buffer 10a. This may, for example, be one of the data paths of the preceding embodiments. Equivalently, further circuitry may be placed between the bi-directional buffer 10b and the second external data path 12b.

However, such circuitry is not shown in FIG. 4 to focus on the basic features of the embodiment, which may provide increased flexibility in using the memory die. The external data paths 12a and 12b are shown as external connections or paths of the memory die. However, these could also be implemented in any other way, allowing to connect to further circuitry. In the embodiment of FIG. 4, the first and second bi-directional buffers act depending on a control signal, such that the first bi-directional buffer 10a or the second bi-directional buffer 10b couples the memory array data terminal 8 to one of the first external data paths 12a or the second external data path 12b at a time. To this end, the first and second bi-directional buffers 10a and 10b may be enabled by enabled signals provided on data lines 80a and 80b. However, the control signal could also be provided to or act differently on the bi-directional buffers 10a and 10b. For example, the control signal may directly be provided to the buffers, or to an optional control logic 90, which is adapted to receive the control signal and to activate, dependent on the control signal, one of the first or the second bi-directional buffers 10a or 10b to couple the corresponding external data path and the memory array terminal.

FIG. 4 shows one possible implementation, as to how to provide the control signal to the optional control logic 90. The control signal may be provided to the control logic 90 via an external control signal data path 92. However, this is just one of the various possible options. The control logic may be implemented as active logic, performing computations based on the control signal, or as a passive circuitry network.

When specific control logic 90 is present, the control logic may be adapted to receive a control signal which indicates the data path to be used, wherein the control logic activates the bi-directional buffer arranged between the memory array terminal 8 and the external data path to be used. In some further embodiments, the control logic may be adapted to receive a control signal indicating the data path used by a further or neighboring memory die, wherein the control logic may be adapted to activate the bi-directional buffer arranged between the memory array data terminal 8 and the external data path which is not used by the further memory die (coupled to the memory array data terminal of the further memory die). For example, the control signal could indicate that a neighboring die has its memory array data terminal coupled to the first external data path 12a. Hence, the control logic 90 would activate the second bi-directional buffer 10b in order to couple the memory array data terminal 8 with the second external data path 12b.

In further embodiments, the control logic may be adapted to receive an additional mode control signal, indicating a predetermined mode of operation. Within a memory stack, the mode control signal may, for example, indicate a half-good mode or a full-good mode of operation. A half-good mode of operation may, in a stacked device, mean that only half of the dies used in the stack can be utilized, since one or more dies failed in a quality test. The control logic may then activate only one predetermined buffer of the bi-directional buffers 10a and 10b, as all memory dies within the stack are required to connect their memory array data terminals to the same external data path in the single rank mode.

In a further embodiment of the present invention, the control logic may further receive a disconnect signal, wherein the control logic 90 is adapted to activate neither the first bi-directional buffer 10a nor the second bi-directional buffer 10b. This may allow for an automatic configuration of half-good mode of operation and full-good mode of operation. Once, half-good mode of operation (single rank operation) is decided, not all the memory dies within the stack shall couple to the external data paths within the memory stack. To this extent, the control logics of memory dies being operational but redundant may receive the disconnect signal, such as to disconnect the memory array data terminal 8 of the respective memory dies from the transfer data paths. Alternatively, the control logics may decide on the necessity to disconnect themselves.

Figure 5:
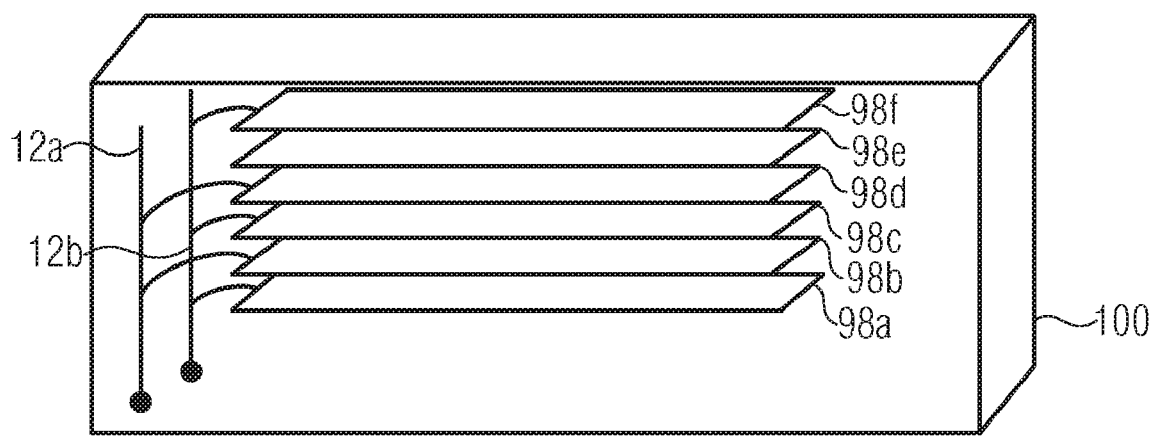
FIG. 5 shows an embodiment of a memory stack.

FIG. 5 gives an example of a possible memory stack 100 built using one of the memory dies previously discussed. As each of the memory dies 98a to 98f within the memory stack 100 may connect either to the first external data path 12a or to the second external data path 12b, high flexibility is gained in creating different memory stack configurations. This is due to the configurable data paths within the individual memory dies 98a to 98f, allowing them to switch between multiple configurations and mode of operations. As becomes apparent from FIG. 5, redundancy concepts may become feasible, in which one or more redundant memory dies may be placed inside a stack, in order to replace other failing memory dies within the stack.

Therefore, a memory stack 100 may comprise a first transfer data path 12a, a second transfer data path 12b and a plurality of memory dies 98a to 98f, which are selectively coupled to the first or to the second transfer data path 12a or 12b. In the embodiment of FIG. 5, the memory dies 98a, 98b, 98c, 98d and 98f are selectively coupled to either the first or the second transfer data path 12a or 12b. However, due to the flexibility, a further memory die 98e may appear inside the stack, which is disconnected from the first and the second transfer data paths 12a and 12b.

That is, within the memory stack 100, a first sub set of memory dies is coupled to the first transfer data path 12a and a second sub set is coupled to the second transfer data path 12b. These different sub sets could, for example, be associated to different ranks within the stack 100. The configuration, whether a particular memory die belongs to a first rank or to a second rank, may, for example, be performed by the memory dies itself. This will be elaborated in more detail below. By forming a memory stack with a redundant memory die, i.e., with a memory die disconnected from the first and the second transfer data paths, a production yield of stacked devices may be significantly increased, since the failure of one single memory die does not automatically render the remaining operational dies unusual.

Figure 5A:
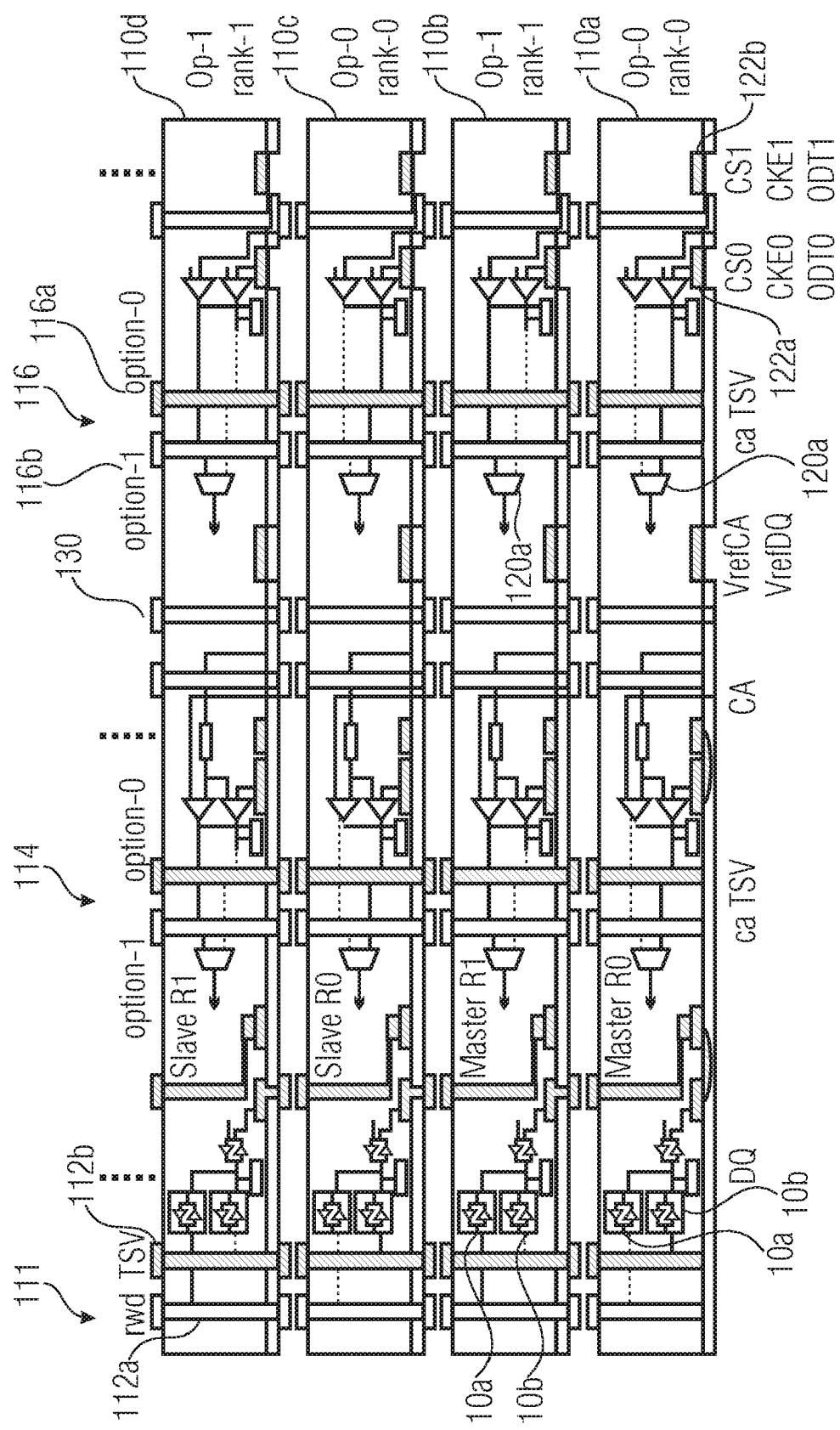
FIGS. 5a and 5b show embodiments of memory stacks using memory dies configured in different rank-configurations.
Figure 5B:
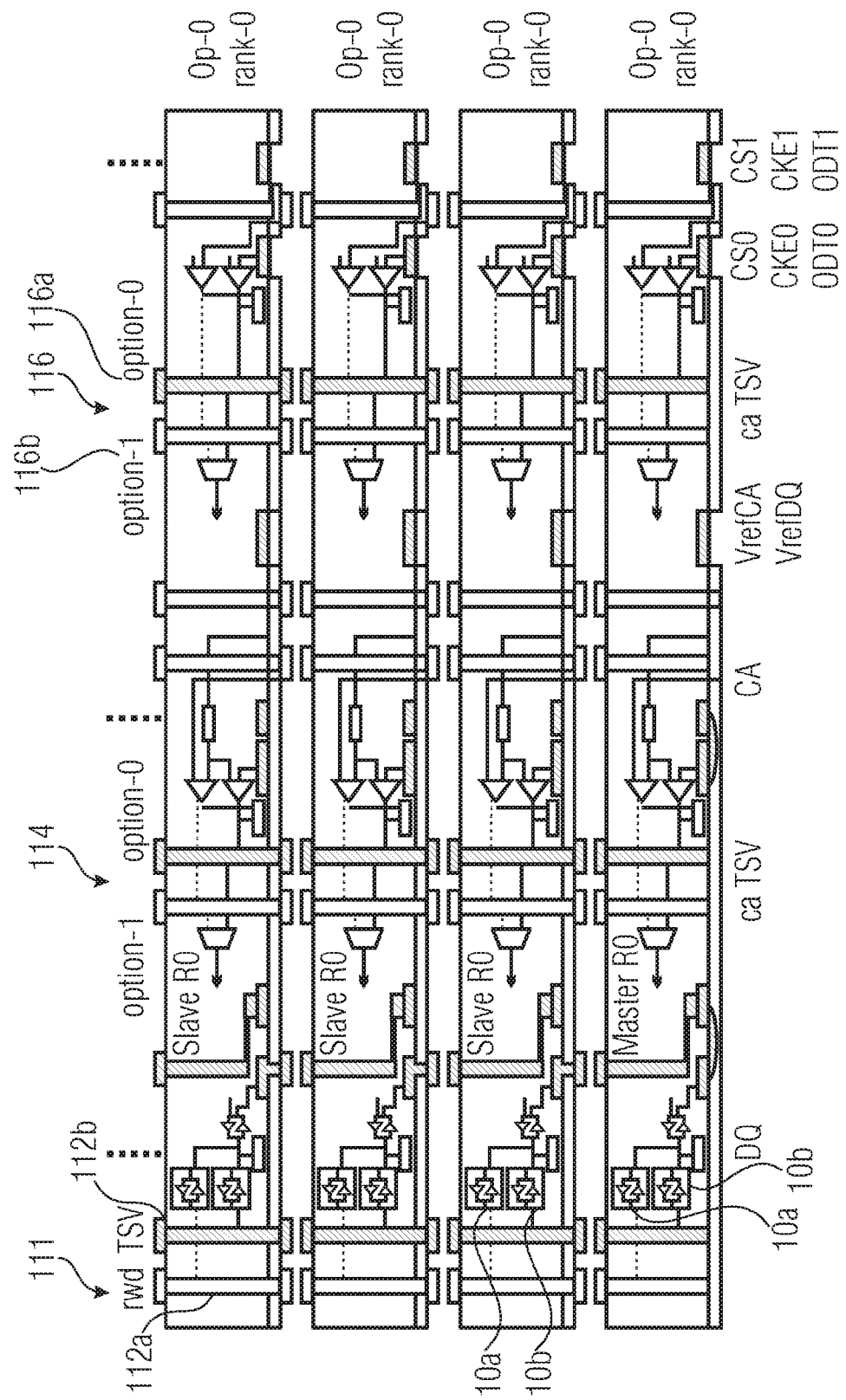

FIGS. 5a and 5b give a more detailed sketch embodiment of the present invention with a plurality of memory dies within a memory stack. Different rank-configurations are illustrated without redundant memory dies. However, possible redundancy-schemes are subsequently described in FIG. 6. FIG. 7 gives an example of a configuration method, describing how the individual memory dies may be configured, when redundancy within a stack is available.

FIGS. 5a and 5b show four memory dies 110a to 110d stacked on top of each other and connected by common external data paths. However, due to the flexibility of the memory dies and their flexible use of data paths, the same memory dies are used in different configurations. FIG. 5a illustrates a dual rank implementation, whereas FIG. 5b illustrates a single rank implementation.

As the following illustration focuses on the flexibility, the memory arrays within the memory dies are not explicitly shown. Contrary to the face-on view of the memory dies of FIGS. 1 to 4, a cut through of the stack is illustrated in FIGS. 5a and 5b, in order to focus on the aspects important to the stacking concept.

The individual memory dies are connected by a plurality of through silicon vias, wherein read-write through silicon via 111 comprises a first external data path (TSV) 112a and a second external data path (TSV) 112b. As the memory dies within the same rank are configured identically, the following discussion will focus on the first and the second memory die 110a and 110b, as these may differ in their configuration.

Between the memory array data terminals (not shown in FIG. 5a) and the read-write transfer data path, first and second bi-directional buffers 10a and 10b are arranged, such that the first bi-directional buffer 10a is arranged between the first external data path 112a and the memory array terminal and that the second bi-directional buffer structure 10b is arranged between the second external data path 112b and the memory array data terminal. It may be noted that the first bi-directional buffer is physically connected to the first external data path 112a as well as the second bi-directional buffer 10b is physically connected to the second external data path 112b. However, only one of the bi-directional buffers 10a or 10b electrically couples the memory array data terminal to the associated external data path. This may be achieved by providing an enable signal to the bi-directional buffer to be used or by any other appropriate measure, for example by switching only the buffers to be used to the supply voltage or the like. To illustrate the implemented coupling, solid lines are used in the figures, whereas dashed lines indicate existing physical connections, which are not used for an electrical coupling.

The second memory die 110b is configured such that the first bi-directional buffer 10a couples the first external data path 112a and a memory array data terminal. The first memory die 110a is configured such that the second bi-directional buffer 10b couples the second external data path 112b and a memory array data terminal.

That is, the memory array data terminals of memory dies 110a and 110b couple to different external transfer data paths. The third memory die 110c couples to the second external data path and the fourth memory die 110d couples to the first external data path again. That is, the memory stack of FIG. 5a is a dual rank implementation, each rank using a different external (transfer) data path (through silicon via). This may be implemented, for example, as a dual rank ×4 I/O mode or as a dual rank ×8 I/O mode. In order to achieve a dual rank implementation, the individual ranks may utilize further individually accessible transfer data paths through silicon vias to transport control and access data, as, for example, the external control/access data paths 114 and 116.

Also the clock signals may be provided independently for the individual ranks. In the embodiment of FIG. 5a, the clock signal is distributed via the control/access data path 116. To this end, multiplexers 120a within the memory dies are configured to either couple to the first control/access data path 116a or to the second control/access data path 116b. The configuration corresponds to the configuration of the external data path 111, such that all memory dies of a rank are connecting to the same control/access data path.

To distribute the clock signal, two clock signal data terminals 122a and 122b are present, wherein different clocking data may be provided for each of the ranks.

However, of course, not all external paths need to be redundant in order to allow for a dual-rank concept. For example, the supply voltage may be distributed by a commonly used voltage transfer data path (TSV) 130.

FIG. 5b illustrates a single rank mode of operation, where, within every memory die, the second bi-directional buffer 10b couples a memory array data terminal to the second external data path 112b, such that all memory dies within the stack share the same transfer data path 112b. This is achieved, by configuring the bi-directional buffers of each memory die to couple identically. The flexibility of the configurable data paths or the use of buffer structures to couple one data terminal of a memory array to different data paths or sub buses of a data bus, requires only one type of memory dies to implement multiple memory stack options.

In other words, when using configurable internal data paths and control buses within single memory dies, physical interlayer to connections in stack devices (e.g., through silicon vias and front/back-side interconnections) may be simplified. Single rank and multi-rank stacked devices may have similar physical interlayer interconnections. The rank numbers can be distinguished by programming internal signal paths in a stack device. For instance, in a dual rank ×4 I/O device, the internal data and control buses in each rank are configured to have different signal paths. Although the through silicon vias may be physically connected to the data buffer circuits in all layers, the layers of each rank may be configured to use signal paths only through their corresponding TSVs.

The stacked device may be configured to be a single rank device by programming the internal signal paths to one common option for the entire stack.

FIG. 5b thus represents a single rank stack device with ×4 I/O using configurable internal or interlayer signal paths. In the particular example of FIG. 5b, all dies (layers) are configured to one choice of external data paths (interlayer signal paths), which is denoted as option-0. The alternative external data paths (option-1) can be applied as a redundancy. If there are failures in one interconnection option, another interconnection may thus be used.

Furthermore, it is feasible to combine the internal data paths of both ranks (×4 I/O) to provide the internal data bus structure of a device with for single rank ×8 I/O.

In summarizing the previously described embodiments, configurable internal signal/data buses are used to achieve multiple configurations and I/O modes. The signal/data paths (which could be both, paths between layers, dies and paths within a layer) can be logically programmed or configured in order to create connectivity for different device configurations. This may reduce the number of die types significantly, hence simplifying the manufacturing process. Moreover, the flexibility may be utilized in redundancy concepts, which may improve the yield in the production of stacked memory devices.

Figure 6:
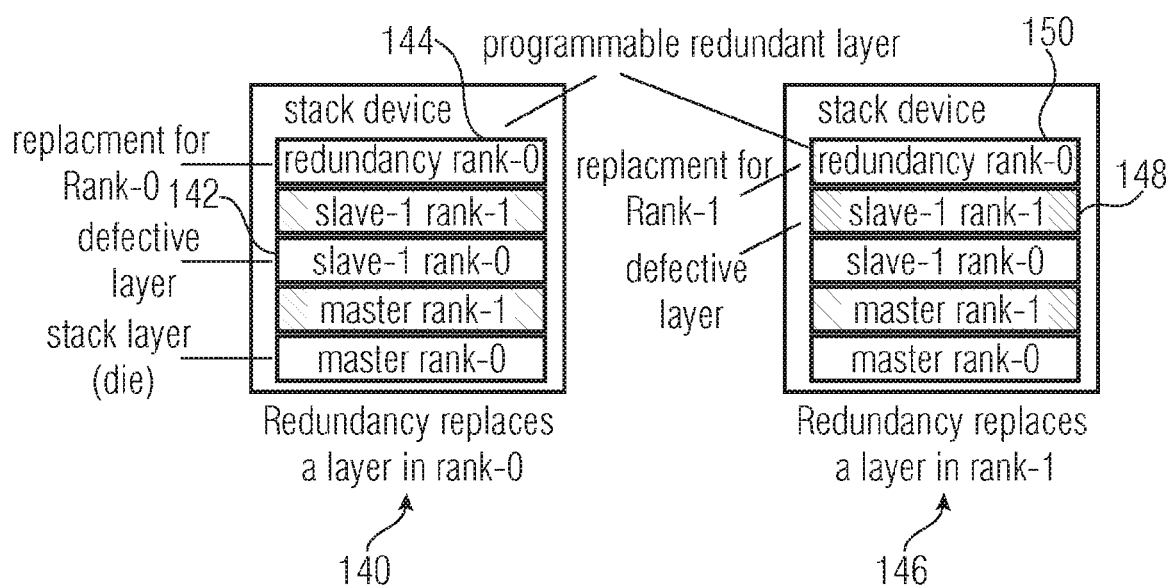
FIG. 6 shows two examples for possible memory die configurations within a memory stack.
Figure 7:
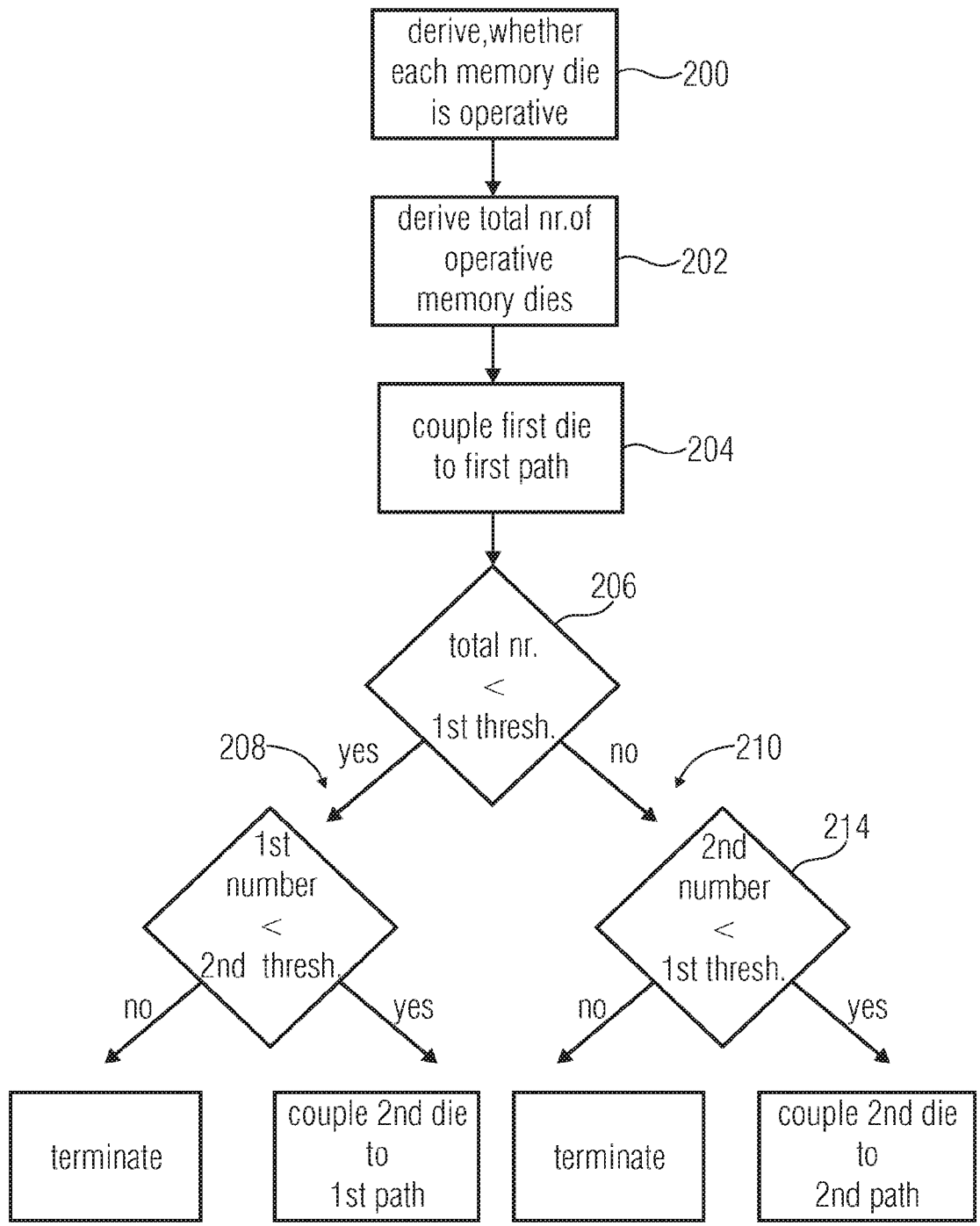
FIG. 7 shows an embodiment of a method for configuring a memory stack.

FIG. 6 shows two examples for memory stacks built using additional redundant layers. The first example 140 shows a dual-rank implementation in which a memory die 142 in rank 0 is defective. As a redundant memory die 144 is configurable, it may replace both, memory dies of rank 0 or of rank 1. Therefore, the redundant memory die 144 may replace the defective memory die 142, thus resulting in a fully operational dual-rank memory stack.

The second example 146 shows a configuration in which a defective memory die 148 of rank 1 is replaced by a redundant memory die 150.

In further embodiments, the remaining memory dies within a stack may also be configurable or programmable, such that a self-organizing memory stack may be provided. This may be achieved by a method for configuring a memory stack. One embodiment of an inventive method for configuring a memory stack will subsequently be presented utilizing the information on a memory stack summarized in the following table.

TABLE 1

| phys. layer-ID | 8 layer flag | alive-layer-ID | rank bit | 8 alive | Comment |
| --- | --- | --- | --- | --- | --- |
| 1000 | 1 | 000 | 0 | 1 | phys-ID = 8 and alive-ID overflow → redundant layer, device will switch off |
| 0111 | 1 | 111 | 1 | 1 | phys-ID = 7 → will set 8 layer flag → stack defaults to 2R operation alive-ID = 7 → will set 8 alive flag |
| 0110 | 1 | 110 | 0 | 1 | All layers: 8 layer flag = 1 → |
| 0101 | 1 | 101 | 1 | 1 | forward inverted rank bit |
| 0100 | 1 | 100 | 0 | 1 | to above layer |
| 0011 | 1 | 011 | 1 | 1 | |
| 0010 | 1 | 010 | 0 | 1 | |
| 0001 | 1 | 001 | 1 | 1 | phys-ID = 1 and 8 layer flag = 1 layer may be master of rank 1 |
| 0000 | 1 | 000 | 0 | 1 | phys-ID = 0 → layer may configure to be master of rank 0 |

The previous table illustrates the configuration of a memory stack built out of nine configurable memory dies. Each row of the table represents one particular memory die of the stack. Each layer has associated configuration data, distributed by at least one external transfer data paths (TSV). The configuration bus or the configuration data includes a physical layer-ID, an 8-layer flag (a threshold signal), an alive-layer-ID, a rank bit and an 8-alive information. The described method is directed to a stack built out of 9 dies, thus allowing the composition of, for example, a dual-rank memory stack with ranks comprising 4 memory dies each. In that event, the physical layer-ID bus and the alive-layer-ID bus may, for example, be implemented containing 4/3 input ports and 4/3 output ports with logic inbetween. Input ports may receive the signals from the layer below, while the output ports may be directly connected to the input ports of the upper layer. This may, for example, be performed by using redistribution layers on the surface of each memory die or using through silicon vias (TSV). In case of the physical layer-ID bus, the through silicon vias forming the physical layer-ID bus of the bottom die (device) may not be driven by a further layer, since there is none underneath the bottom layer. In some embodiments, it may, therefore, be assured that these inputs of the bottom layer are preset to zero.

The physical layer-ID represents the number of the memory dies within a predetermined, ascending order. In a self-organizing embodiment, the correct physical layer-ID for each memory die may be provided by some logic between the input and the output of the physical layer-ID bus, which receives the input value and increases the input value by one (e.g., by binary addition). When the result of this operation is forwarded to the output of the ports associated to the physical layer-ID (on the physical layer-ID bus), the next memory die in the stack receives the correct preceding physical layer-ID. In other words, utilizing this bus in the previously described manner provides the exact physical position for each memory die (layer) within the stack.

The 8 layer flag may be used as a status flag (e.g., signaled by one bit), indicating, whether at least 8 memory dies are present within the memory stack in total. This may be achieved by latching a data path associated to the 8 layer flag weakly to zero within each layer and distributing the data path without further intermediate control logic within a memory stack. A state-flip of the 8 layer flag may be achieved by any arbitrary layer driving a strong 1-signal (logical one state, corresponding to a physical potential by a used convention) to the bus, such that the latches of the remaining memory dies also flip to a stable 1 (comparable to the operation of an R/S flip flop).

In several embodiments of the present invention, an optional control logic may drive the previously described signal to the associated data path, when the physical layer-ID of the die is equal to 7 (binary: $0111_b$) and set the flag to one, if this is the case. Once this is done, all memory dies have access to the information that the stack is built out of at least 8 layers. To the contrary, when less than 8 layers are present, the physical layer-ID will not reach $0111_b$, such that the 8 layer flag remains at its initial value of zero. However, the signaling could, of course, also be performed complementary, i.e., 8 layers may be signaled by a logical value of zero. If, however, the flag is set, the stack of memory dies may default to a 2 rank configuration. That is, each individual memory die or control logic associated to the memory die may interpret the 8 layer flag as a rank-mode signal indicating a multi-rank mode of operation or a single-rank mode of operation.

The alive layer-ID may be distributed via an alive ID bus within the memory stack. The alive-layer-ID of the bottom memory die may be chosen to default to zero. Each operational memory may increment the value of the alive-layer-ID by one. However, in case a memory die is non-operational, the memory die or the associated control logic may not increment the alive-layer-ID. In other words, when no memory die is defective, the bus behaves exactly like the physical layer-ID. In case one or more memory dies are defective, the behavior is different, since the defective memory dies do not increase the counter. Thus, the alive-layer-ID counts the operational (the active or alive) layers within the stack. Furthermore, the 8 alive flag indicates whether at least 8 alive layers have been detected within the stack. To this end, the steering or control logic for the 8 alive signal and its corresponding external data path may be implemented as previously described for the 8 layer flag.

The rank bit indicates, to which rank the memory dies are associated. In case the dual-rank mode of operation is indicated, the rank bit may be inverted by each functional or operative layer within the stack.

Further embodiments comprise so-called master dies (layers) for each rank, which physically connect two package pins of the complete memory stack. That is, the stack may be housed and the housing may couple to external circuitry via the package pins. For master-dies, the rank bit may be processed slightly different. Since in these embodiments, the functionality of a master may be associated with one specific memory die of the stack, the master dies may program their rank bit to fit a predetermined rank they are connected to. Since, at least, one rank is implemented within each memory stack, a memory die with the physical ID of 0000 may therefore predetermine its rank bit to rank zero. When the 8 layer flag is set, the memory die with the physical ID 0001 may, for the same reason, predetermine its rank bit to one and serve as a master for rank 1. The remaining (slave) memory dies may use the input value of the rank flag as information in which rank they are operating in. As previously described, when a layer is defective, the defective layer may forward the received rank flag rather than inverting it.

When the configuration of the previous table undergoes the configuration process or the associated configuration method, the top most layer will result with the physical layer ID of 1000 and an alive-layer-ID greater than 8 (an overflow of 000). This condition may be evaluated by an integrated control logic, which causes the memory die to switch off, since 9 active, operational layers, provide no valid device stack configuration.

The following table shows a further possible configuration resulting from the previously described method for configuring a memory stack.

TABLE 2

| phys. layer-ID | 8 layer flag | alive-layer-ID | rank bit | 8 alive | Comment |
|---|---|---|---|---|---|
| 1000 | 1 | 111 | 1 | 1 | alive-ID = 7 → will set 8 alive flag no alive-ID overflow → layer (die) active |
| 0111 | 1 | 110 | 0 | 1 | phys-ID = 7 → will set 8 layer flag → stack defaults to 2R operation |
| 0110 | 1 | 101 | 1 | 1 | Defect ! |
| 0101 | 1 | 100 | 0 | 1 | Layer defect -> switch off and forward alive ID and rank bit to above layer |
| 0100 | 1 | 100 | 0 | 1 | |
| 0011 | 1 | 011 | 1 | 1 | |
| 0010 | 1 | 010 | 0 | 1 | |

TABLE 2-continued

| phys. layer-ID | 8 layer flag | alive-layer-ID | rank bit | 8 alive | Comment |
|---|---|---|---|---|---|
| 0001 | 1 | 001 | 1 | 1 | phys-ID = 1 and 8 layer flag = 1 layer may be master of rank 1 |
| 0000 | 1 | 000 | 0 | 1 | phys-ID = 0 → layer may configures to be master of rank 0 in |

In the configuration, one memory die (the slave device with the physical layer-ID 0100) is non-operational. This could, for example, be found out during a self test or by external testing, marking the die as defective (e.g., by e-fuse). The non-operational memory die may switch off and may only maintain the configuration buses alive. According to the previously described method, the memory die increments the physical layer-ID by one, but does not increment the alive-layer-ID. Furthermore, the rank bit is not inverted by the non-operational memory die. The next die following the defect or non-operational die in the stacking direction replaces the defect die. The top most device in the stack does not get an alive-ID overflow (since it has an alive-ID of 111) and will stay active. The method thus arrives at a fully operational, dual rank memory stack.

The following table 3 provides a further possible result of the method if two memory dies within a stack of nine memory dies have been considered to be non-operational.

TABLE 3

| phys. layer-ID | 8 layer flag | alive-layer-ID | rank bit | 8 alive | Comment |
|---|---|---|---|---|---|
| 1000 | 1 | 110 | 0 | 0 | 8 alive = 0 and MSB of alive-ID = 1 -> redundant, switch off |
| 0111 | 1 | 110 | 0 | 0 | Defect ! phys-ID = 7 → will set 8 layer flag → stack defaults to 2R operation layer defect -> switch off and forward alive ID and rank bit |
| 0110 | 1 | 101 | 0 | 0 | 8 alive = 0 and MSB of alive-ID = 1 ->redundant, switch off |
| 0101 | 1 | 100 | 0 | 0 | |
| 0100 | 1 | 100 | 0 | 0 | |
| 0011 | 1 | 011 | 1 | 0 | 8 alive = 0 and MSB of alive-ID = 1 ->redundant, switch off Defect ! |
| 0010 | 1 | 010 | 0 | 0 | |
| 0001 | 1 | 001 | 1 | 0 | phys-ID = 1 and 8 layer flag = 1 layer may be master of rank 1 |
| 0000 | 1 | 000 | 0 | 0 | phys-ID = 0 → layer may configure to be master of rank 0 in |

Since two memory dies do not increase the alive-layer-ID, the top most memory die receives the alive-layer-ID 110. That is, no individual layer has an alive-layer-ID of 111 and consequently, the 8 alive flag stays at zero. Control logic or control logic of the individual memory dies may evaluate the control buses and recognize that less than 8 operational memory dies are contained within the memory stack. Since the stack does not contain 8 active layers, a two-rank configuration utilizing the maximum number of memory dies may not be possible. The memory die control logic may, therefore, default to a further possible configuration, which may, for example, be a 2-rank configuration having two operational memory dies in each rank. That is, memory dies having an alive-layer-ID greater than 011 are redundant and switch off. This configuration method could principally work down to all kind of configurations, up to a minimum possible stack size, having two active layers in a two-rank configuration, that is, one active layer in one rank.

In a further embodiment, when the number of operational layers exceeds 4 and stay below 8, the control logic associated to the memory dies may decide to choose a one-rank option, such that, for example, 4 operational memory dies form a one-rank configuration.

If the external circuitry is designed and restricted to a 2-rank operation, the control logic may be designed to only fall back to two-rank modes, when non-operational layers are detected.

In other words, several embodiments provide a method for configuring a memory stack with configurable data paths using configuration buses and integrated logic to create redundancy options (for example half good options) within a memory device (die) stack. The device stack built from memory dies detects automatically, for example, at power up, how many layers are present and how many layers are active and default to a valid configuration without any need of external programming or additional power of sequences.

That is, the configuration is performed fully transparent to the remaining system. Although previously detailed for an embodiment using maximally 8 operational memory dies to provide, it goes without saying that further embodiments of the inventive method may be applied to configurations with arbitrary number of memory dies and/or ranks. For example, three or four rank memory stacks may be configured using the method. Additionally, the number of memory dies configured by the method may be increased to a nominal stack size of 12, 16 or even to an arbitrary number of memory dies.

Further embodiments of inventive methods for configuring a memory stack derive, for each memory die, whether the memory die is operative or inoperative. The total number of operative memory dies in the memory stack is derived. A first operative memory die is associated to a first rank. This may be rank zero, when the very first memory die is configured.

It is decided whether the total number of operative memory dies is below a first threshold. The first threshold may correspond to the number of memory dies of the maximum-configuration. That is, the first threshold would, for example, be 8 for the dual-rank implementation with four memory dies per rank discussed previously. However, the first threshold may be chosen to be any number fitting the requirements, such as, for example, 12, 16, 20 or more.

When the total number of operative memory dies is below the first threshold, a second operative memory die is attributed to the same rank, while the number of memory dies associated to the first rank is lower than or equal to a second threshold, which is lower than the first threshold. That is, up to the second threshold, all memory dies are associated to the same rank. This does, for example, mean for the previously discussed dual-rank configuration with four memory dies in each rank, that the further memory die to be configured is also associated to the first rank, as long as a number of memory dies corresponding to the second threshold is associated to the first rank. In the case of a fall-back option of a single rank device with four memory dies, the second threshold may consequently be chosen to be 4.

If, however, the total number of operative memory dies is equal to or exceeds the first threshold, the second memory die is associated with the second rank, while the total number of memory dies associated to either the first or the second rank (the second number of memory dies) is lower than or equal to the first threshold. That is, the second memory die processed after the first memory die is associated to a different rank than the first memory die, as long as the total number of memory dies to be used is not exceeded.

The method can be used to automatically configure arbitrary memory stack designs. For example, a design with four ranks can be accomplished. That is, further embodiments of methods for configuring a memory stack are feasible, in which the first threshold is an integer multiple of the second threshold. That is, for example, for a four-rank configuration the maximum usable number of memory dies in the stack may be 16. Therefore, the first threshold may be chosen to be 16 and the second threshold may be chosen to be 4.

FIG. 7 is a flow diagram of a further embodiment of a method for configuring a memory stack, which comprises a plurality of memory dies, each memory die of the plurality of memory dies comprising a memory array data terminal, wherein a first bi-directional buffer is arranged between the memory array data terminal and the first transfer data path and wherein a second bi-directional buffer is arranged between the memory array data terminal and a second transfer data path. The method describes as to how to proceed with a second memory die, once a first memory die has been coupled to its associated transfer data path.

In a control step 200, it is, for each memory die, derived whether the memory die is operative or inoperative.

In a counting step 202, the total number of operative memory dies in the memory stack is derived.

In a coupling step 204, the memory array data terminal of a first operative memory die is coupled to the first transfer data path.

In a first decision step 206, it is decided whether the total number of operative memory dies is below a first threshold. According to the decision, the method proceeds either in a first branch 208 or in a second branch 210.

When the total number of operative memory dies is below the first threshold, the first branch 208 is followed, and it is decided whether a first number of memory dies with memory array data terminals coupled to the first transfer data path is lower than a second threshold, which is lower than the first threshold. If this is the case, the memory array data terminal of a second operative memory die is coupled to the first transfer data path. If this is not the case, the method may terminate, i.e., the memory array data terminal of the second operative memory die is neither coupled to the first nor to the second transfer data path.

In other words, when the total number of operative memory dies is below the first threshold, the memory array data terminal of a second operative memory die is coupled to the first transfer data path, while a first number of memory dies with memory array data terminals coupled to the first transfer data path is lower than or equal to a second threshold.

When the total number of operative dies is equal to or greater than the first threshold, the second path 210 is followed. That is, when the total number of operative memory dies is equal to or greater than the first threshold, a further rank mode decision 214 is taken, whether a total number of memory dies connected to either the first or the second transfer data path is lower than the first threshold. If this is the case, the memory array data terminal of the second operative memory die is coupled to the second transfer data path. If this is not the case, i.e., if the total number of memory dies already coupled to the first or to the second transfer data path equals or exceeds the first threshold, the method terminates, i.e., the memory array data terminal of the second memory die is connected neither to the first nor to the second transfer data path.

The evaluation whether the first and/or second thresholds are exceeded or not may, for example, be taken according to the previously described embodiments. However, any further method is, of course, possible. That is, for example, the total number of memory dies may be evaluated by an external circuitry or by a test process. In further embodiments, each individual memory die may evaluate an internal counter to issue a threshold signal, when the evaluation indicates that the internal counter equals the first threshold in order to allow a threshold decision.

Figure 8:
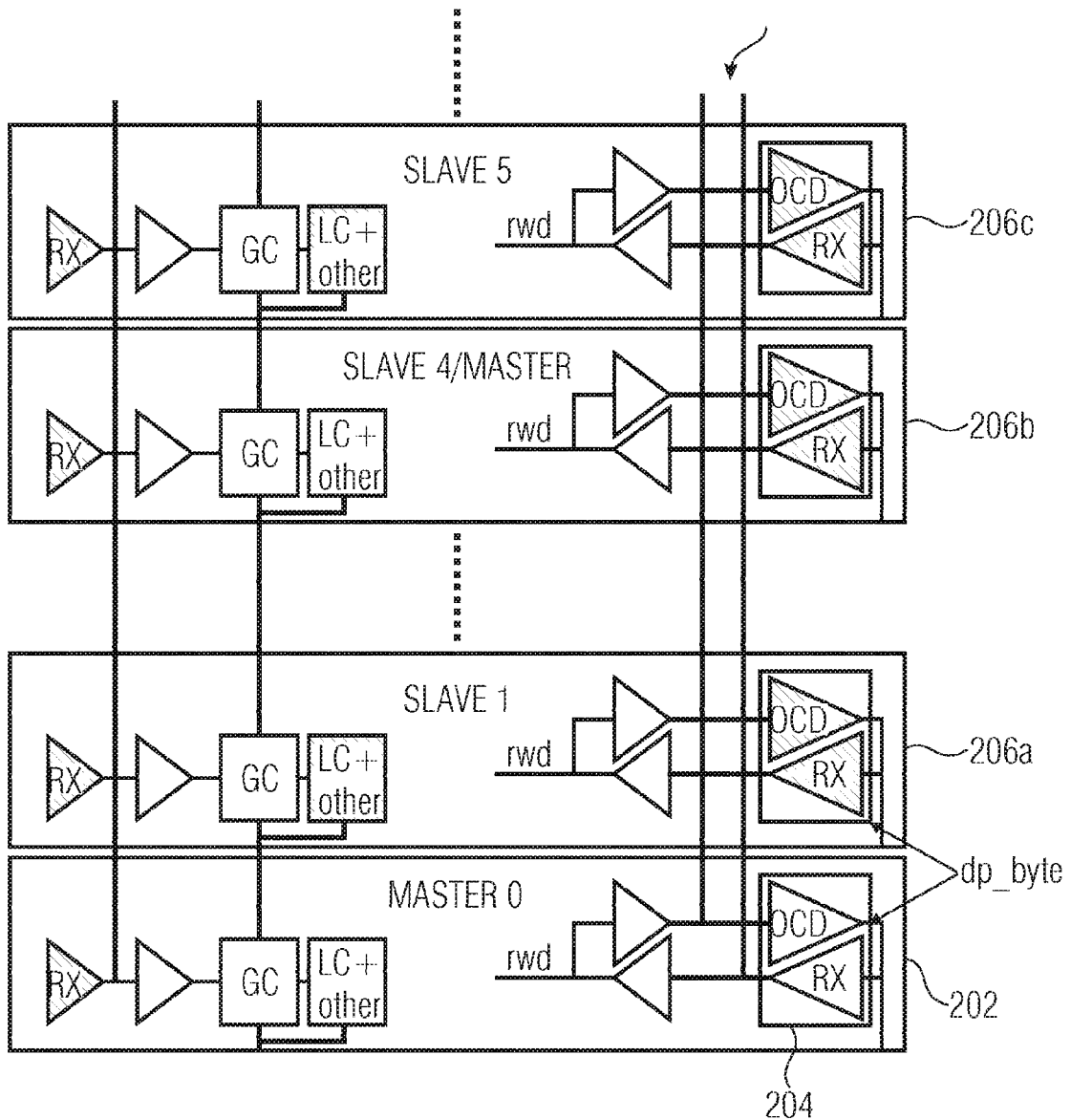
FIG. 8 shows an embodiment of a memory stack with master/slave configuration.

FIG. 8 shows a further embodiment of a memory stack comprising memory dies having configurable data paths. In the embodiment of FIG. 8, TSV-connections between the individual memory dies are used. The configurable data paths, i.e., the flexibility gained in using configurable data paths may be used in order to define a master-die. The master-die 202 differs from the remaining dies in the stack mainly by an active bi-directional buffer 204 (dp_byte) which buffers the access to the slave-dies 206a to 206c via the read/write TSV-bus 208. Utilizing embodiments of inventive memory dies with variable data paths, a memory stack may even be successfully built when the bottom layer physically connected to the chip pins fails, such that, for example, the first slave layer 206a may be utilized as a master die instead.

In other words, the embodiment of the invention shown in FIG. 8 shows an implementation example based on (but not limited to) a TSV connection. The lower device "Master 0" is a regular memory die that has its CA bus and DQ bus connected (bonded) to the package pins. The other layers (dice) have all their I/O pins not connected (floating). The shown vertical lines are communication and data buses within the device stack. The Master 0 device monitors all commands issued to all devices and controls the internal communication and data buses accordingly. The commands issued to the slave devices are also received at the Master 0 device and forwarded to the upper devices. Depending on the final implementation there might be a preprocessing of the commands done within the Master 0 device or each device decides (based on configuration/status bits) if the command is valid or issued to a different layer.

The Master 202 needs to control all the input and output data (dp_byte) of all upper layers. The data is sent/received by the dp_byte of the Master 202 and forwarded to the named Read and Write Date TSV bus. To ensure the correct timing to the memory controller the Master 202 may control all responds to commands given to different ranks (a memory controller may do this by switching the appropriate chip-select), it may control the entire command stack for all ranks. This may be done by doubling control logic in the Master 0 (e.g., latency counters, global control) or by adding synchronization and control buses between the control units of the different layers. Since only the Master 0 device has connections to the package pins, the capacitive load $C_{10}$ of one pin does not depend on the number of layers, as it is only one single load of the master. This may provide high density multi-rank memory devices with no decrease of performance due to increased pin parasitics.

Although the different embodiments of the invention previously discussed relate to DRAM-components, further embodiments of the present invention may use other memory technologies, such as, for example, flash, SRAM, optical or magnetic storage media or the like.

Further embodiments may use other I/O modes or configurations than the ones detailed in the previous embodiments. For example, wider data-buses may be used, such as, for example, data buses with a width of 128, 256 or 512 bits.

Furthermore, the data array terminals of the previous embodiments may be flexibly connectable to more than two data paths. In further embodiments, an arbitrary number of bi-directional buffers per memory array data terminal may be used to selectively couple the memory array data terminal to a greater number of sub buses of a data bus. That is, for example, one memory array data terminal may be selectively coupled to four or more sub buses.

It may be furthermore noted that the redundancy concepts of stacked memory dies previously described do show one single redundant memory die within the stack. In further embodiments, more than one redundant memory die is introduced, which may enhance the flexibility and the yield further. That is, for example, 2, 3 or 4 redundant memory dies may be used in a stack, which would then comprise at least 2, 3 or 4 memory dies not connected to any of the transfer data paths.

Depending on certain implementation requirements, further embodiments of methods to configure the data memory stack may be implemented in hardware or in software. The implementation may be performed using a digital storage medium, in particular a disk, DVD or a CD having electronically readable control signals stored thereon, which cooperate with a programmable computer system such that embodiments of the methods are performed. Generally, some embodiments may, therefore, be a computer program product with a program code stored on a machine readable carrier, the program code being operative for performing the embodiments of access methods when the computer program product runs on a computer. In other words, some embodiments are, therefore, a computer program having a program code for performing at least one of the methods when the computer program runs on a computer.

What is claimed is:

1. A memory die, comprising:
   a memory array;
   a memory array data terminal;
   a data bus comprising a first sub bus and a second sub bus;
   a first bi-directional buffer arranged between the memory array data terminal and the first sub bus; and
   a second bi-directional buffer arranged between the memory array data terminal and the second sub bus;
   wherein the first and second bi-directional buffers are adapted to couple one of the first sub bus or the second sub bus to the memory array data terminal at a time.

2. The memory die of claim 1, comprising:
   a first external data path adapted to electrically couple to a further memory die;
   a second external data path adapted to electrically couple to a further memory die;
   a third bi-directional buffer arranged between the first external data path and the first sub bus and adapted to couple the first external data path and the first sub bus when the first bi-directional buffer couples the first sub bus and the memory array data terminal; and
   a fourth bi-directional buffer arranged between the second external data path and the second sub bus and adapted to couple the second external data path and the second sub bus when the second bi-directional buffer couples the second sub bus and the memory array data terminal.

3. The memory die of claim 2, wherein,
   in a low data bandwidth mode, one of the third bi-directional buffer and the fourth bi-directional buffer is coupled to the corresponding sub bus, and wherein
   in a high data bandwidth mode, both the third bi-directional buffer and the fourth bi-directional buffer are coupled to the corresponding sub buses.

4. The memory die of claim 3, comprising:
a first switch arranged between the first sub bus and a reference potential; and
a second switch arranged between the second sub bus and the reference potential; wherein
in the low data band width mode, one of the first switch or the second switch connects the respective sub bus to the reference potential and the other switch disconnects the other sub bus from the reference potential, and wherein
in the high data bandwidth mode, both the first switch and the second switch disconnect the respective sub buses from the reference potential.

5. The memory die of claim 1, wherein
the first sub bus forms a first external data path adapted to electrically couple to a further die;
the second sub bus forms a second external data path adapted to electrically couple to a further die; and
wherein, dependent from a control signal, the first or the second bi-directional buffer couples the memory array data terminal to one of the first external data path or the second external data path.

6. The memory die of claim 5, wherein the control signal comprises a rank mode signal and a rank indicator signal, wherein
the first bi-directional buffer couples the memory array data terminal to the first external data path when the rank mode signal indicates a single rank mode operation, and wherein
when the rank mode signal indicates a multi-rank mode operation,
the first bi-directional buffer couples the memory array data terminal to the first external data path when the rank indicator signal has a first value, and
the second bi-directional buffer couples the memory array data terminal to the second external data path when the rank indicator signal has a second value.

7. A memory die, comprising:
a memory array;
a memory array data terminal;
a first external data path adapted to electrically couple to a further memory die;
a second external data path adapted to electrically couple to a further memory die;
a first bi-directional buffer arranged between the memory array data terminal and the first external data path;
a second bi-directional buffer arranged between the memory array data terminal and the second external data path, wherein
dependent from a control signal, the first or second bi-directional buffer couples the memory array data terminal to one of the first external data path or the second external data path at a time.

8. The memory die of claim 7, in which the external data paths are through silicon vias extending through the memory die.

9. The memory die of claim 7, comprising:
a control logic adapted to receive the control signal and to activate, dependent on the control signal, one of the first or the second bi-directional buffers to couple the corresponding external data path and the memory array data terminal.

10. The memory die of claim 9, wherein the control logic is adapted to receive a control signal indicating the data path of the first or the second external data paths coupled to a memory array data terminal of a further memory die, wherein
the control logic is adapted to activate the bi-directional buffer arranged between the memory array data terminal and the external data path not being coupled to the memory array data terminal of the further memory die.

11. The memory die of claim 9, wherein the control logic further comprises a mode input adapted to receive a mode control signal, the mode control signal indicating a half-good mode or a full-good mode of operation, wherein the control logic is adapted to exclusively activate the first bi-directional buffer structure when receiving a mode control signal indicating the half-good mode of operation.

12. The memory die of claim 9, wherein the control logic is further adapted to receive a disconnect signal, wherein the control logic activates none of the bi-directional buffers when receiving the disconnect signal.

13. A memory stack, comprising:
a first transfer data path;
a second transfer data path;
a plurality of memory dies, each of the plurality of the memory dies comprising:
a memory array;
a memory array data terminal;
a first bi-directional buffer arranged between the memory array data terminal and the first transfer data path;
a second bi-directional buffer arranged between the memory array data terminal and the second transfer data path, wherein
dependent from a control signal, the first or second bi-directional buffer couples the memory array data terminal to one of the first transfer data path or the second transfer data path at a time.

14. The memory stack of claim 13, wherein
a first sub set of memory dies with memory array data terminals coupled to the first transfer data path; and
a second sub set of memory dies with memory array data terminals coupled to the second transfer data path, the second subset comprising the same number of memory dies as the first subset.

15. The memory stack of claim 13, wherein the memory array data terminal of least one of the plurality of memory dies is neither coupled to the first transfer data path nor to the second transfer data path.

16. Method for configuring a memory stack comprising a plurality of memory dies, each memory die of the plurality of memory dies comprising a memory array data terminal, a first bi-directional buffer arranged between the memory array data terminal and a first transfer data path and a second bi-directional buffer arranged between the memory array data terminal and a second transfer data path, comprising:
for each memory die, deriving, whether the memory die is operative or inoperative;
deriving a total number of operative memory dies in the memory stack;
coupling the memory array data terminal of a first operative memory die to the first transfer data path;
deciding, whether the total number of operative memory dies is below a first threshold; and
when the total number of operative memory dies is below the first threshold,
coupling the memory array data terminal of a second operative memory die to the first transfer data path while a first number of memory dies with memory array data terminals coupled to the first transfer data path is below or equal to a second threshold, the second threshold being lower than the first threshold; or
when the total number of operative memory dies is equal to or greater than the first threshold,
coupling the memory array data terminal of the second operative memory die to the second data transfer path, while a second number of memory dies with memory array data terminals coupled to the first or the second transfer data path is lower than or equal to the first threshold.

17. Method according to claim 16, wherein the first threshold is an integer multiple of the second threshold.

18. Method according to claim 16, wherein deriving the total number of memory dies in the stack comprises:
incrementing an internal counter by each operative memory die.

19. Method according to claim 18, wherein deriving, whether the total number of operative memory dies is below a first threshold comprises:
evaluating the internal counter by each memory die of the stack; and
issuing a threshold signal when the evaluation of a memory die indicates that the internal counter equals the first threshold.

* * * * *